(12) United States Patent
Qiang et al.

(10) Patent No.: US 10,546,646 B2
(45) Date of Patent: Jan. 28, 2020

(54) SENSE AMPLIFIER FOR A FLASH MEMORY SYSTEM

(71) Applicant: Silicon Storage Technology, Inc., San Jose, CA (US)

(72) Inventors: Xiaozhou Qiang, Shanghai (CN); Xiao Yan Pi, Shanghai (CN); Kai Man Yue, Shanghai (CN); Li Fang Bian, Shanghai (CN)

(73) Assignee: SILICON STORAGE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 16/117,987

(22) Filed: Aug. 30, 2018

(65) Prior Publication Data

US 2019/0385685 A1    Dec. 19, 2019

(30) Foreign Application Priority Data

Jun. 15, 2018   (CN) .......................... 2018 1 0619270

(51) Int. Cl.
| | |
|---|---|
| G11C 16/26 | (2006.01) |
| G11C 16/28 | (2006.01) |
| G11C 16/32 | (2006.01) |
| G11C 16/24 | (2006.01) |

(52) U.S. Cl.
CPC .............. *G11C 16/28* (2013.01); *G11C 16/24* (2013.01); *G11C 16/32* (2013.01)

(58) Field of Classification Search
CPC .......... G11C 16/28; G11C 16/24; G11C 16/32
See application file for complete search history.

(56) References Cited

U.S. PATENT DOCUMENTS

| | | | | |
|---|---|---|---|---|
| 7,957,197 B2* | 6/2011 | Nguyen | ................... | G11C 7/02 365/185.17 |
| 8,169,831 B2* | 5/2012 | Nguyen | ................... | G11C 7/02 365/185.17 |
| 8,830,776 B1* | 9/2014 | Choy | ........................ | G05F 1/46 365/218 |
| 8,848,419 B2* | 9/2014 | Wu | ........................ | G11C 11/419 365/148 |
| 2009/0296488 A1* | 12/2009 | Nguyen | ................... | G11C 7/02 365/185.21 |
| 2011/0205804 A1* | 8/2011 | Nguyen | ................... | G11C 7/02 365/185.21 |
| 2014/0043886 A1* | 2/2014 | Wu | ........................ | G11C 11/419 365/148 |
| 2014/0269132 A1* | 9/2014 | Choy | ........................ | G05F 1/46 365/218 |

* cited by examiner

*Primary Examiner* — Xiaochun L Chen
(74) *Attorney, Agent, or Firm* — DLA Piper LLP US

(57) ABSTRACT

An improved low-power sense amplifier for use in a flash memory system is disclosed. The reference bit line and selected bit line are pre-charged during a limited period and with limited power consumed. The pre-charge circuit can be trimmed during a configuration process to further optimize power consumption during the pre-charge operation.

12 Claims, 5 Drawing Sheets

US 10,546,646 B2

SENSE AMPLIFIER FOR A FLASH MEMORY SYSTEM

PRIORITY CLAIM

This application claims priority under 37 CFR Section 1.55 to China Patent Application No. 201810619270.9, filed on Jun. 15, 2018, and titled "Improved Sense Amplifier for a Flash Memory System," which is incorporated by reference herein.

TECHNICAL FIELD

An improved low-power sense amplifier for use in a flash memory system is disclosed.

BACKGROUND OF THE INVENTION

Flash memory systems are well-known. In typical flash memory systems, a sense amplifier is used to read data from a flash memory cell.

FIG. 1 depicts a prior art sense amplifier 100. Sense amplifier 100 comprises selected flash memory cell 102, which is the cell to be read. Sense amplifier 100 also comprises reference flash memory cell 122, against which selected flash memory cell 102 is compared. PMOS transistors 104, 106, 124, and 126 and NMOS transistors 108, 110, 112, 128, and 130 are arranged as shown. PMOS transistor 104 is controlled by CASREF (column address sensing reference), PMOS 106 is controlled by SEN_B (sense amplifier enable, active low), NMOS transistors 108, 112, and 128 are controlled by ATD (address transition detection, which detects a change in the received address), and NMOS transistors 110 and 130 are controlled by YMUX (Y multiplexor) which activates a BL (bit line). Selected flash memory cell 102 receives WL (word line) and SL (source line), and reference memory cell 122 receives SL (source line). Comparator 130 receives two inputs that are directly related to the current drawn by selected flash memory cell 102 and reference memory cell 122, and the output SOUT is directly indicative of the data value stored in selected flash memory cell 102.

One drawback of prior art sense amplifier 100 is that a constant current is drawn by memory cell 102 and its associated circuitry, which results in significant power consumption. In addition, reference memory cell 122 and its associated circuitry typically are provided in a separate read bank than the read bank in which selected memory cell 102 is located, which requires a large die area and more power consumption for additional Y-decoding. Also, the CASREF signal also is sensitive to noise, and the CASREF circuit also consumes significant standby current.

FIGS. 2, 3A, and 3B depict improved sense amplifier 200 previously designed by Applicant, and which is described in China Patent Application 201511030454.4, filed on Dec. 31, 2015, and titled "Low Power Sense Amplifier for a Flash Memory System," which is incorporated herein by reference.

With reference to FIG. 2, sense amplifier 200 comprises reference circuit 280 and read circuit 290.

Reference circuit 280 comprises reference memory cell 206, NMOS transistors 202, 204, and 220, PMOS transistor 212, reference bit line 208, level shifter 214, inverter 218, and NOR gate 216, all configured as shown. NMOS transistor 202 is controlled by ATD (address transition detection), NMOS transistor 204 is controlled by YMUX (Y multiplexor), and NMOS transistor 220 is controlled by a BIAS signal. NOR gate 216 receives ATD as one of its inputs.

Read circuit 290 comprises selected memory cell 236, NMOS transistors 232, 234, and 250, PMOS transistor 242, bit line 238, level shifter 244, inverter 248, and NOR gate 246, all configured as shown. NMOS transistor 232 is controlled by ATD (address transition detection), NMOS transistor 234 is controlled by YMUX (Y multiplexor), and NMOS transistor 250 is controlled by a BIAS signal. NOR gate 246 receives ATD as one of its inputs. Thus, reference circuit 280 and read circuit 290 are identical, except that reference circuit 280 comprises reference memory cell 206, and read circuit 290 comprises selected memory cell 236.

In operation, sense amplifier 200 works as follows. Prior to a read operation, the BIAS signal is high, which pulls the voltage at the output of inverters 218 and 248 to ground through NMOS transistors 220 and 250, which causes ROUT and SOUT to be high. At the beginning of a read operation, ATD goes high, which signifies a detection in the change of the address received by the memory system, which coincides with the beginning of a read operation. NMOS transistors 202 and 232 are turned on, as are NMOS transistors 204 and 234 by YMUX. This allows reference cell 206 and selected memory cell 236 to draw current. Concurrently, reference bit line 208 and bit line 238 will begin charging. BIAS also goes low at the beginning of the read operation. At this stage, PMOS transistors 212 and 242 are off, as the voltage on its gate will be high.

ATD will then go low, which shuts off NMOS transistors 202 and 232. Reference bit line 208 will begin discharging through reference cell 206. As it does so, the voltage of reference bit line 208 will decrease, and at some point will drop low enough (below VREF) such that PMOS transistor 212 turns on. This causes ROUT to drop to low. Meanwhile, bit line 238 also is discharging through selected memory cell 236. As it does so, the voltage of bit line 238 will decrease, and at some point will drop low enough (below VREF) such that PMOS transistor 242 turns on. This causes SOUT to drop to low. Once ROUT/SOUT drop to low, each sense amplifier has a local feedback (216, 218 or 246, 248) to cut off its bias current, which reduces the power consumption.

Essentially, there is a race condition between reference circuit 280 and read circuit 290. If selected memory cell 236 draws more current than reference cell 206 (which would be the case if selected memory cell 236 is storing a "1" value), then SOUT will drop to low before ROUT drops to low. But if selected memory cell 236 draws less current than reference cell 206 (which would be the case if selected memory cell 236 is storing a "0" value), then SOUT will drop to low after ROUT drops to low. Thus, the timing of SOUT and ROUT dropping to low indicates the value stored in selected memory cell 236.

SOUT and ROUT are input into timing comparison circuit 260, and the output is DOUT, which indicates the value stored in selected memory cell 236.

FIG. 3A depicts a first embodiment of timing comparison circuit 260. Here, timing comparison circuit 260 comprises flip-flop 310, with SOUT as the D input, ROUT as the active low clock CK, and DOUT as the output. When ROUT goes low before SOUT, then DOUT will output a "0," indicating that selected memory cell 236 is storing a "0." When ROUT goes low after SOUT, then DOUT will output a "1," indicating that selected memory cell 236 is storing a "1."

FIG. 3B depicts a second embodiment of timing comparison circuit 260, which comprises an R-S latch. Timing comparison circuit 260 comprises inverters 320 and 322 and NAND gates 324 and 326 configured as shown, with SOUT and ROUT as inputs, and DOUT as the output. When ROUT goes low before SOUT, then DOUT will output a "0," indicating that selected memory cell 236 is storing a "0." When ROUT goes low after SOUT, then DOUT will output a "1," indicating that selected memory cell 236 is storing a "1."

While the system of FIGS. 2, 3A, and 3B is an improvement over the prior art system of FIG. 1, the system of FIGS. 2, 3A, and 3B still consumes a significant amount of power during the pre-charge process for the reference bit line 208 and the selected bit line 238.

What is needed is an improved sense amplifier that reduces power consumption compared to the systems of FIGS. 1, 2, 3A, and 3B by reducing the power consumption during the pre-charge process for reference bit lines and selected bit lines.

SUMMARY OF THE INVENTION

An improved low-power sense amplifier for use in a flash memory system is disclosed. The reference bit line and selected bit line are pre-charged during a limited period and with limited power consumed. The pre-charge circuit can be trimmed during a configuration process to further optimize power consumption during the pre-charge operation.

DETAILED DESCRIPTION OF THE PREFERRED EMBODIMENTS

Figure 4:
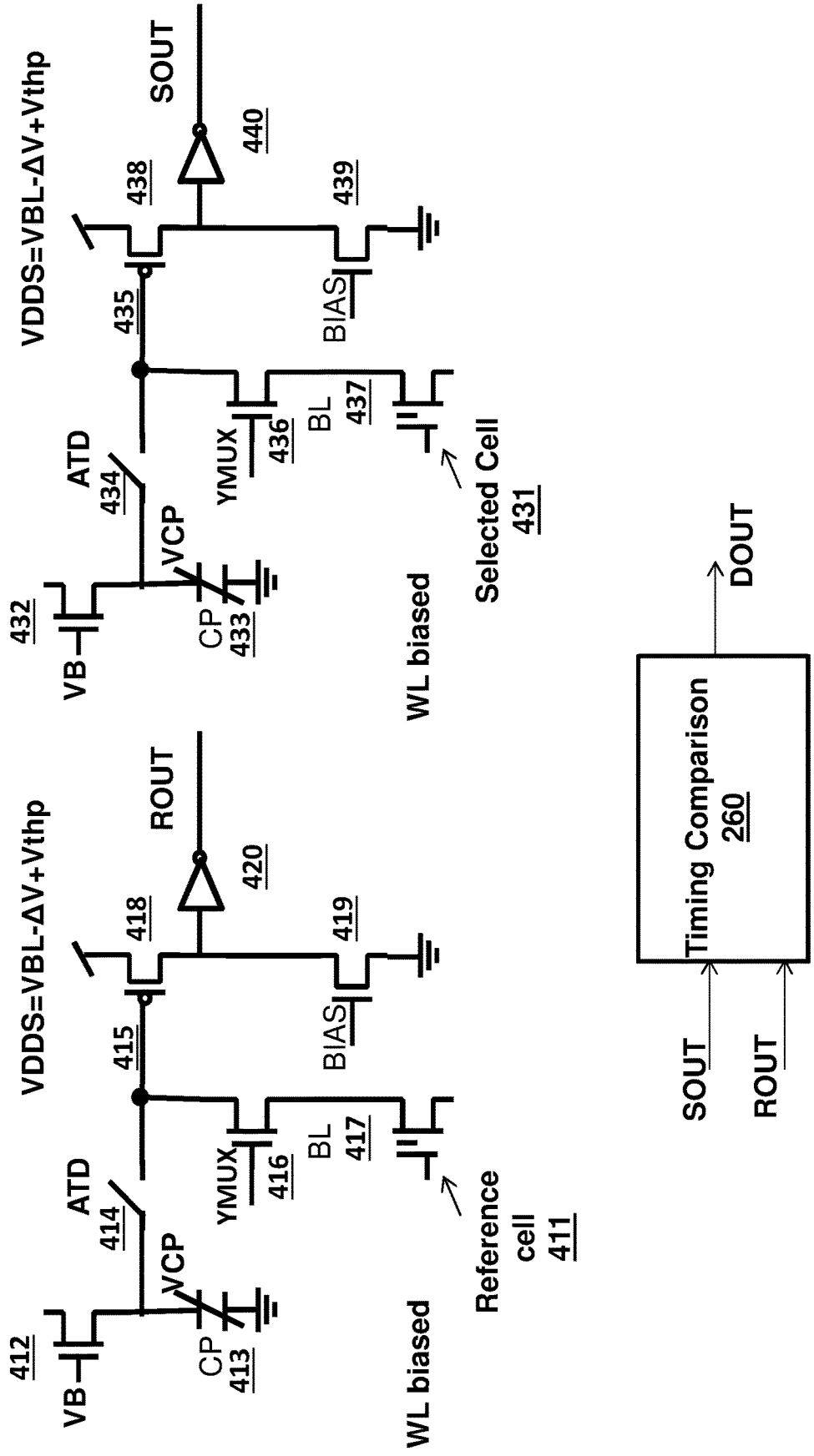
FIG. 4 depicts another embodiment of the low-power sense amplifier for a flash memory system.

FIG. 4 depicts sense amplifier 400. Sense amplifier 400 comprises reference circuit 410 and read circuit 430.

Reference circuit 410 comprises reference memory cell 411, NMOS transistors 412, 416, and 419. PMOS transistor 418, switch 414, node 415, reference bit line 417, inverter 420, and variable capacitor 413, all configured as shown. NMOS transistor 412 is controlled by VB, NMOS transistor 416 is controlled by YMUX (part of a column decoder for selecting the column containing reference memory cell 411), NMOS transistor 419 is controlled by BIAS, switch 414 is controlled by ATD (address transition detection), and PMOS transistor 418 is controlled by node 415.

Read circuit 430 comprises selected memory cell 431, NMOS transistors 432, 436, and 439. PMOS transistor 438, switch 434, node 435, selected bit line 437, inverter 440, and variable capacitor 433, all configured as shown. NMOS transistor 432 is controlled by VB, NMOS transistor 436 is controlled by YMUX (part of a column decoder for selecting the column containing selected memory cell 431), NMOS transistor 439 is controlled by BIAS, switch 434 is controlled by ATD (address transition detection), and PMOS transistor 438 is controlled by node 435.

In operation, sense amplifier 400 works as follows. Prior to a read operation, the BIAS signal is high, which turns on NMOS transistors 419 and 439 and pulls the input of inverters 420 and 440 to ground, which causes ROUT and SOUT to be high. At the beginning of a read operation, ATD goes high, which signifies a detection in the change of the address received by the memory system, which coincides with the beginning of a read operation. When ATD goes high, switches 414 and 434 are closed. NMOS transistors 416 and 436 are turned on by YMUX. This allows reference cell 411 and selected memory cell 431 to draw current. Initially, variable capacitors 413 and 433 will be storing a voltage that was generated during a charging process by voltage NMOS transistors 412 and 432 before switches 414 and 434 were closed. After switches 414 and 434 are closed, the charges on capacitors 413 and 433 are shared to nodes 415 and 435, respectively, in a short period. Meanwhile, reference cell 411 will draw current from variable capacitor 413, and selected cell 431 will draw current from variable capacitor 433.

ATD will then go low, which opens switches 414 and 434. Node 415 and reference bit line 417 will continue discharging through reference cell 411. As this occurs, the voltage of node 415 will decrease, and at some point will drop low enough (below VDDS-Vthp, where VDDS is a voltage source provided to PMOS transistors 418 and 438 and Vthp is the threshold voltage of PMOS transistors 418 and 438) such that PMOS transistor 418 turns on. This causes ROUT to drop to low. Meanwhile, node 435 and selected bit line 437 also are discharging through selected memory cell 431. As this occurs, the voltage of node 435 will decrease (below VDDS-Vthp) and at some point will drop low enough such that PMOS transistor 438 turns on. This causes SOUT to drop to low.

Essentially, there is a race condition between reference circuit 410 and read circuit 430. If selected memory cell 431 draws more current than reference cell 411 (which would be the case if selected memory cell 431 is storing a "1" value), then SOUT will drop to low before ROUT drops to low. But if selected memory cell 431 draws less current than reference cell 411 (which would be the case if selected memory cell 431 is storing a "0" value), then SOUT will drop to low after ROUT drops to low. Thus, the relative timing of SOUT and ROUT dropping to low indicates the value stored in selected memory cell 431.

Figure 1:
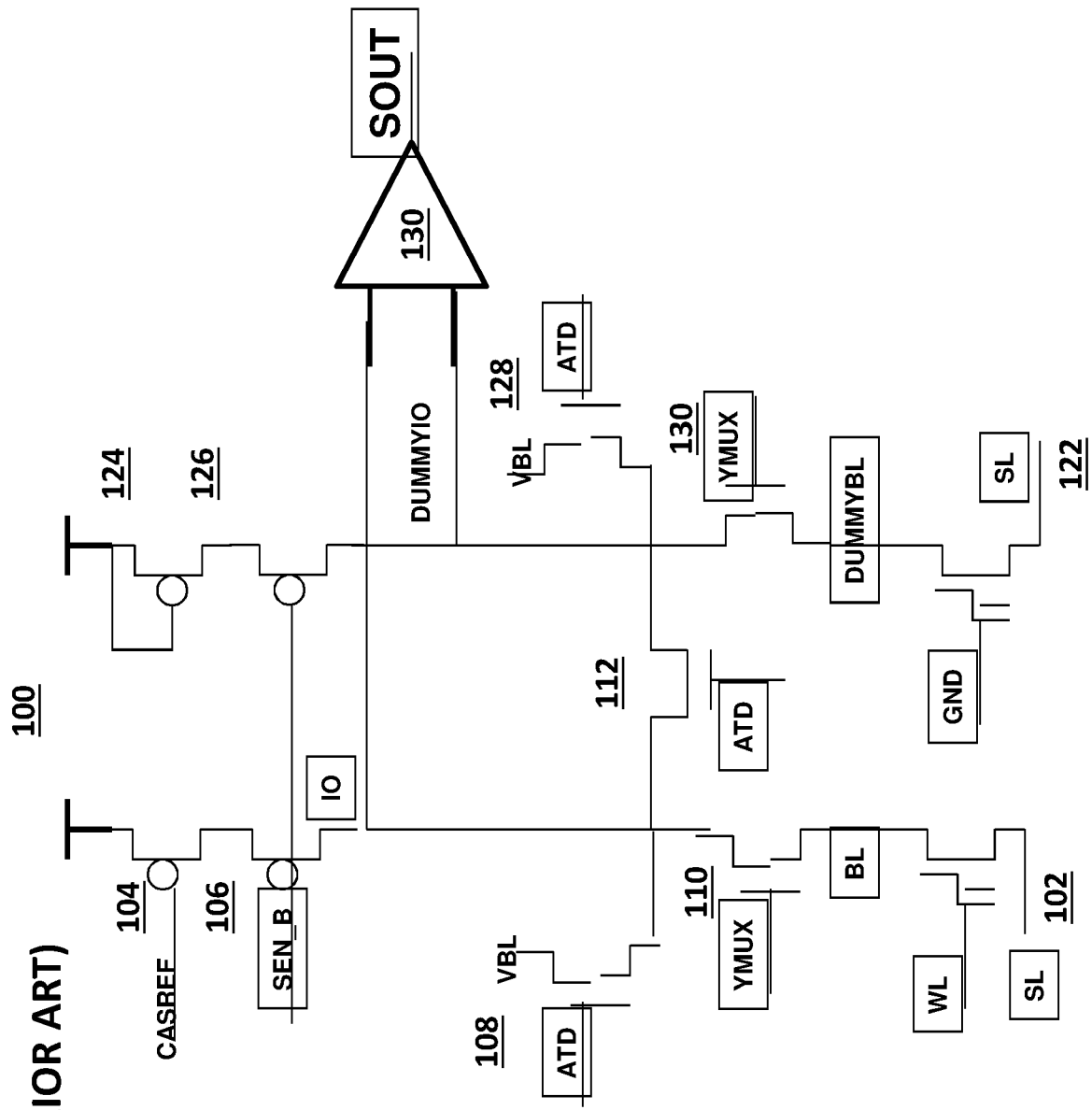
FIG. 1 depicts a prior art sense amplifier in a flash memory system.
Figure 2:
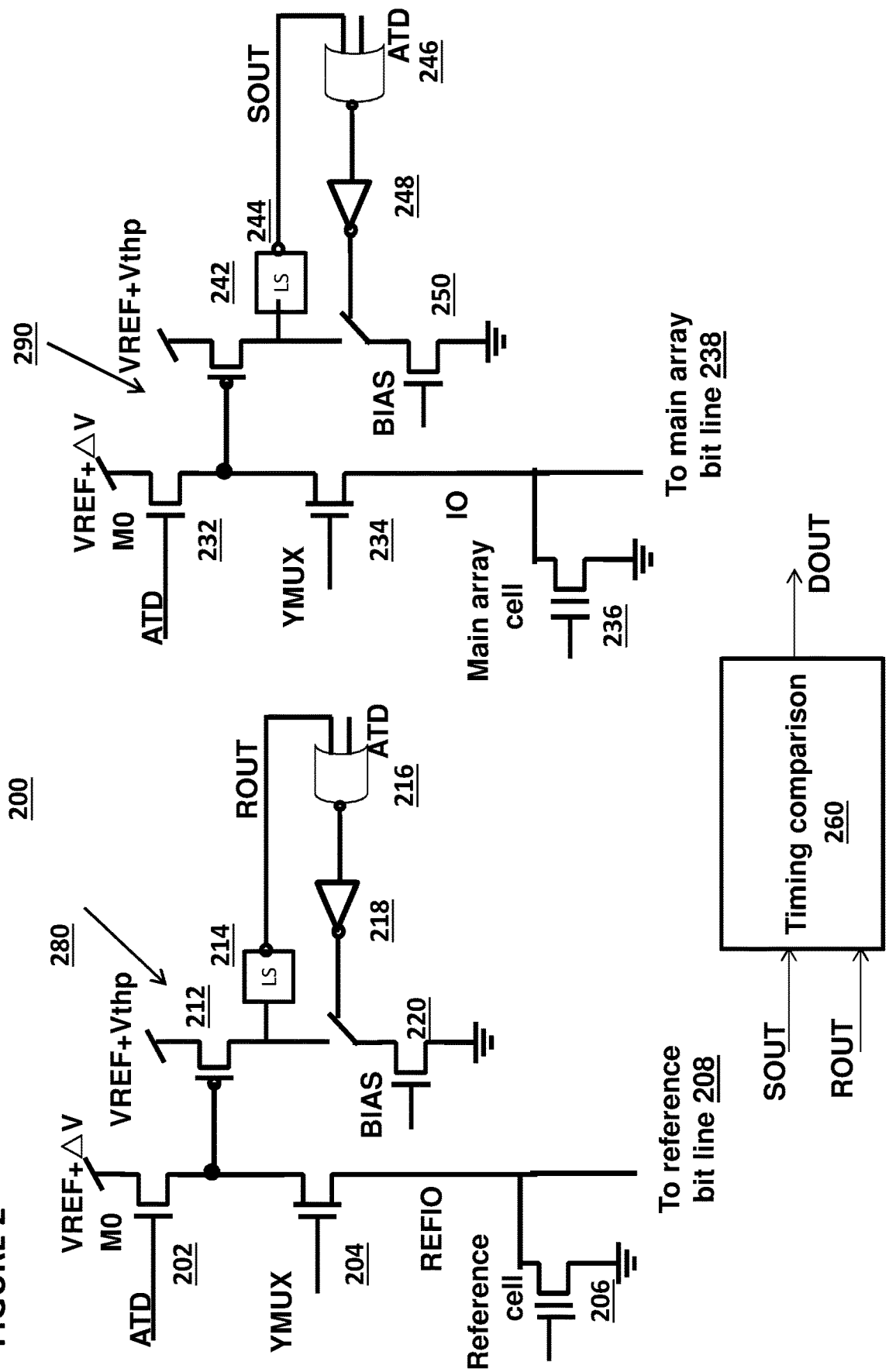
FIG. 2 depicts an embodiment of a low-power sense amplifier for a flash memory system previously disclosed by Applicant.
Figure 3A:
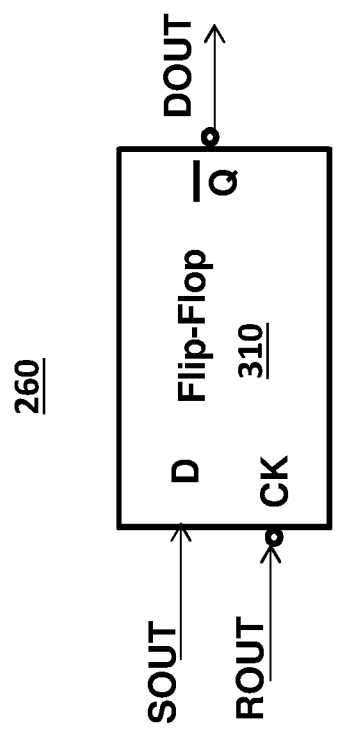
FIG. 3A depicts an embodiment of a timing circuit for use in a sense amplifier.
Figure 3B:
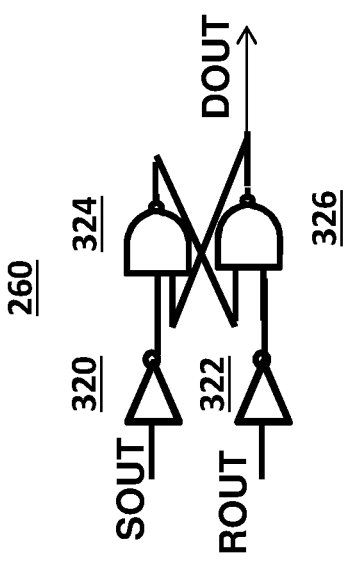
FIG. 3B depicts another embodiment of a timing circuit for use in a sense amplifier.

SOUT and ROUT are input into timing comparison circuit 260, and the output is DOUT, which indicates the value stored in selected memory cell 236. Timing comparison circuit 260 can comprise the structures described previously with respect to FIG. 3A or 3B or can comprise another timing circuit.

Figure 5:
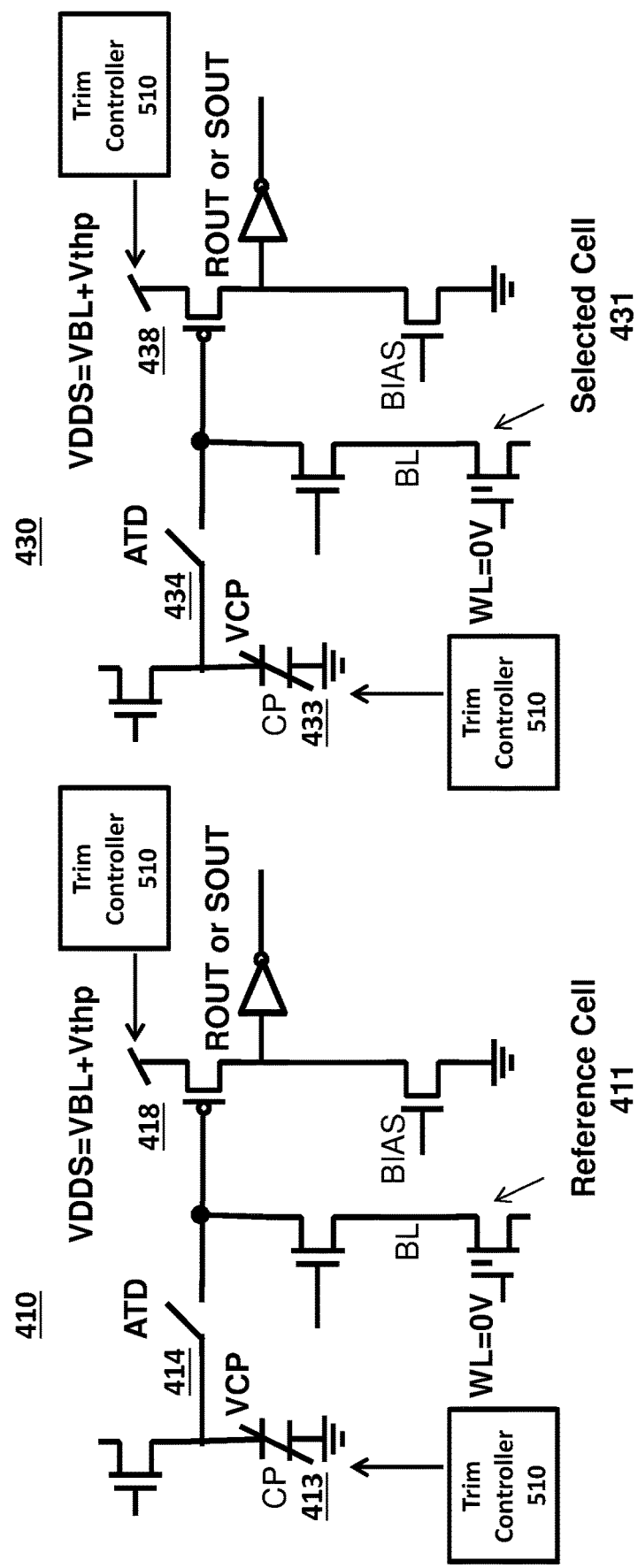
FIG. 5 depicts a trimming operation of the sense amplifier of FIG. 4.

FIG. 5 depicts a configuration phase for reference circuit 410 and read circuit 430. Trim controller 510 optionally can adjust the voltage VDDS using known techniques. Similarly, trim controller 510 can adjust the capacitance of variable capacitors 413 and 433 to alter the voltage that is initially provided to nodes 415 and 435 when ATD goes high and switches 414 and 434 are closed.

References to the present invention herein are not intended to limit the scope of any claim or claim term, but instead merely make reference to one or more features that may be covered by one or more of the claims. Materials, processes and numerical examples described above are exemplary only, and should not be deemed to limit the claims. It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between). For example, forming an element "over a substrate" can include forming the element directly on the substrate with no intermediate materials/elements there between, as well as forming the element indirectly on the substrate with one or more intermediate materials/elements there between.

What is claimed is:

1. A flash memory system, comprising:
   a read circuit comprising a selected flash memory cell, a first bit line coupled to the selected flash memory cell, a first capacitor, and a first switch, wherein at the beginning of a read operation, the first switch is closed and the first capacitor charges the first bit line and then the first switch is opened and the first bit line discharges through the selected flash memory cell;
   a reference circuit comprising a reference flash memory cell, a second bit line coupled to the reference flash memory cell, a second capacitor, and a second switch, wherein at the beginning of a read operation, the second switch is closed and the second capacitor charges the second bit line and then the second switch is opened and the second bit line discharges through the reference flash memory cell; and
   a timing comparison circuit for outputting a first value when the voltage of the first bit line drops below a voltage threshold before the voltage of the second bit line during a read operation and for outputting a second value when the voltage of the second bit line drops below the voltage threshold before the voltage of the first bit line during a read operation, wherein the first value and second value each indicate a value stored in the selected flash memory cell.

2. The flash memory system of claim 1, wherein the first capacitor is a variable capacitor and the second capacitor is a variable capacitor.

3. The flash memory system of claim 1, wherein the timing comparison circuit comprises a flip-flop.

4. The flash memory system of claim 2, wherein the timing comparison circuit comprises a flip-flop.

5. The flash memory system of claim 1, wherein the timing comparison circuit comprises an R-S latch.

6. The flash memory system of claim 2, wherein the timing comparison circuit comprises an R-S latch.

7. A flash memory system, comprising:
   a read circuit comprising a selected flash memory cell, a first bit line coupled to the selected flash memory cell, a first variable capacitor, and a first switch, wherein at the beginning of a read operation, the first switch is closed and the first variable capacitor charges the first bit line and then the first switch is opened and the first bit line discharges through the selected flash memory cell;
   a reference circuit comprising a reference flash memory cell, a second bit line coupled to the reference flash memory cell, a second variable capacitor, and a second switch, wherein at the beginning of a sense operation, the second switch is closed and the second variable capacitor charges the second bit line and then the second switch is opened and the second bit line discharges through the reference flash memory cell;
   a timing comparison circuit for outputting a first value when the voltage of the first bit line drops below a voltage threshold before the voltage of the second bit line during a read operation and for outputting a second value when the voltage of the second bit line drops below the voltage threshold before the voltage of the first bit line during a read operation, wherein the first value and second value each indicate a value stored in the selected flash memory cell; and
   a trim controller for adjusting the capacitance of the first variable capacitor and the capacitance of the second variable capacitor during a calibration process.

8. The flash memory system of claim 7, wherein the trim controller is configured to adjust a voltage source for the reference circuit and the read circuit during the calibration process.

9. The flash memory system of claim 7, wherein the timing comparison circuit comprises a flip-flop.

10. The flash memory system of claim 8, wherein the timing comparison circuit comprises a flip-flop.

11. The flash memory system of claim 7, wherein the timing comparison circuit comprises an R-S latch.

12. The flash memory system of claim 8, wherein the timing comparison circuit comprises an R-S latch.

* * * * *

UNITED STATES PATENT AND TRADEMARK OFFICE
CERTIFICATE OF CORRECTION

PATENT NO. : 10,546,646 B2
APPLICATION NO. : 16/117987
DATED : January 28, 2020
INVENTOR(S) : Xiaozhou Qian et al.

It is certified that error appears in the above-identified patent and that said Letters Patent is hereby corrected as shown below:

On the Title Page

(12) "Qiang et al." should read --Qian et al.--

(72) Inventors: "Xiaozhou Qiang" should read --Xiaozhou Qian--

Signed and Sealed this
Seventh Day of April, 2020

Andrei Iancu
*Director of the United States Patent and Trademark Office*